(12) United States Patent
VanNortwick

(10) Patent No.: US 6,281,044 B1
(45) Date of Patent: Aug. 28, 2001

(54) METHOD AND SYSTEM FOR FABRICATING SEMICONDUCTOR COMPONENTS

(75) Inventor: John VanNortwick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/356,267

(22) Filed: Jul. 16, 1999

Related U.S. Application Data

(63) Continuation-in-part of application No. 09/033,497, filed on Mar. 2, 1998, now Pat. No. 6,025,212, which is a continuation of application No. 08/509,048, filed on Jul. 31, 1995, now abandoned.

(51) Int. Cl.$^7$ ...................................................... H01L 21/58

(52) U.S. Cl. .......................... 438/111; 438/118; 438/123; 438/108; 438/126

(58) Field of Search ...................................... 438/111, 118, 438/123, 112, 126, 613, 620, 669, 675, 735; 257/666, 676, 787, 689, 108, 783

(56) References Cited

U.S. PATENT DOCUMENTS

| | | | |
|---|---|---|---|
| 4,118,858 | * 10/1978 | Taylor et al. ........................... | 29/622 |
| 4,141,075 | * 2/1979 | Taylor, Jr. et al. ................... | 364/712 |
| 4,193,834 | 3/1980 | Bernardi . | |
| 4,279,682 | 7/1981 | Hamagami et al. . | |
| 4,649,415 | * 3/1987 | Herbert .................................. | 357/74 |
| 4,839,227 | * 6/1989 | Hoopman ............................ | 428/343 |
| 4,862,245 | 8/1989 | Pashby et al. . | |
| 4,916,036 | * 4/1990 | Chieky ................................. | 429/127 |
| 4,916,519 | 4/1990 | Ward . | |
| 4,985,105 | 1/1991 | Masuda . | |
| 4,994,411 | 2/1991 | Naito et al. . | |
| 5,087,494 | * 2/1992 | Calhoun ................................ | 428/40 |
| 5,278,101 | 1/1994 | Ikenoue . | |
| 5,285,105 | 2/1994 | Cain . | |
| 5,286,679 | 2/1994 | Farnworth et al. . | |
| 5,432,127 | 7/1995 | Lamson et al. . | |

(List continued on next page.)

FOREIGN PATENT DOCUMENTS

| | | | |
|---|---|---|---|
| 2 278 497 | 11/1994 | (GB) . | |
| 2 288 909 | 1/1995 | (GB) . | |
| 51-067932 | * 6/1976 | (JP) ......................................... | 23/16 |
| 57147568 | * 3/1981 | (JP) ......................................... | 5/18 |
| 57-139162 | * 8/1982 | (JP) ............................................... | 7/2 |
| 59101330 | * 12/1982 | (JP) ......................................... | 17/4 |
| 58-31514 | 2/1983 | (JP) . | |
| 60-35527 | 2/1985 | (JP) . | |
| 61-56419 | 3/1986 | (JP) . | |

OTHER PUBLICATIONS

PCT Application WO 00/42648 Schrock et al; Class: HO1/ 21/58; Jul. 2000.*

Primary Examiner—Charles Bowers
Assistant Examiner—Laura Schillinger
(74) Attorney, Agent, or Firm—Stephen A. Gratton

(57) ABSTRACT

A method for fabricating semiconductor components, such as BGA packages, chip scale packages, and multi chip modules, includes the steps of cutting decals from ribbons of adhesive tape, and then attaching a semiconductor die to a substrate using the decals. A system for performing the method includes a tape cutting apparatus configured to cut the decals from the tape without wasted tape, and then to apply the cut decals to the substrate. A first finished dimension (e.g., width) of the decals is determined by a width of the tape, and a second finished dimension (e.g., length) of the decals is determined by indexing the tape through a selected distance. The tape cutting apparatus includes cutters configured to move through guide openings to cut and apply the decals to the substrate. The guide openings align the tape to the cutters, and also align the cut decals to the substrate. The system also includes a substrate handling apparatus configured to index and position the substrate relative to the guide openings.

20 Claims, 8 Drawing Sheets

U.S. PATENT DOCUMENTS

| | | |
|---|---|---|
| 5,432,380 | 7/1995 | Jin et al. . |
| 5,455,200 | 10/1995 | Bigler et al. . |
| 5,548,160 | 8/1996 | Corbett et al. . |
| 5,696,033 * | 12/1997 | Kinsman ............... 437/217 |
| 5,789,803 * | 8/1998 | Kinsman ............... 257/666 |
| 5,946,553 | 8/1999 | Wood et al. . |
| 5,990,566 | 11/1999 | Farnworth et al. . |
| 6,002,165 | 12/1999 | Kinsman . |
| 6,012,502 * | 1/2000 | VanNortwick et al. ............. 156/518 |
| 6,013,948 | 1/2000 | Akram et al. . |
| 6,020,629 | 2/2000 | Farnworth et al. . |
| 6,025,212 * | 2/2000 | VanNortwick et al. ............. 438/111 |
| 6,028,354 * | 2/2000 | Hoffman ............... 257/706 |
| 6,048,755 | 4/2000 | Jiang et al. . |
| 6,049,125 | 4/2000 | Brooks et al. . |
| 6,057,597 | 5/2000 | Farnworth et al. . |
| 6,097,087 | 8/2000 | Farnworth et al. . |
| 6,133,522 * | 10/2000 | Kataoka et al. ..................... 136/259 |

* cited by examiner

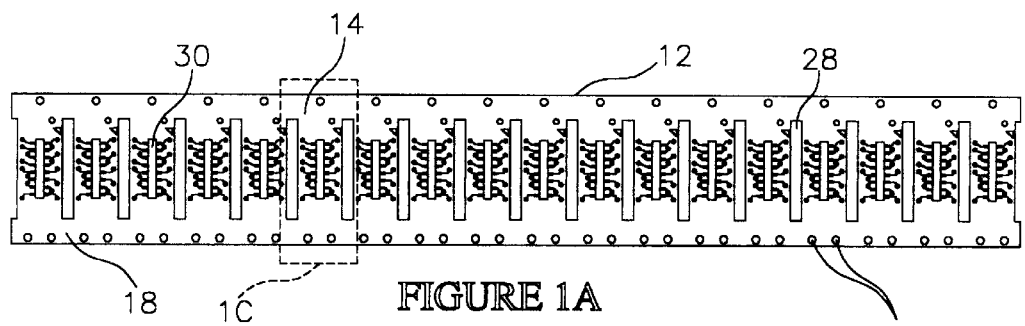
FIGURE 1A
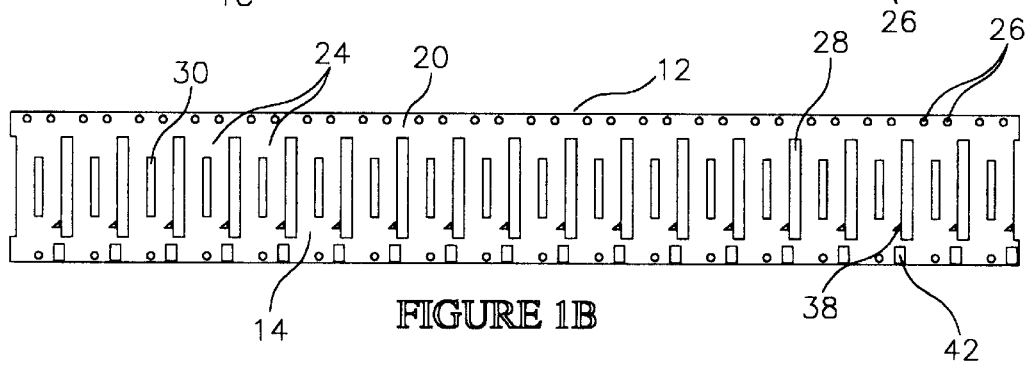
FIGURE 1B
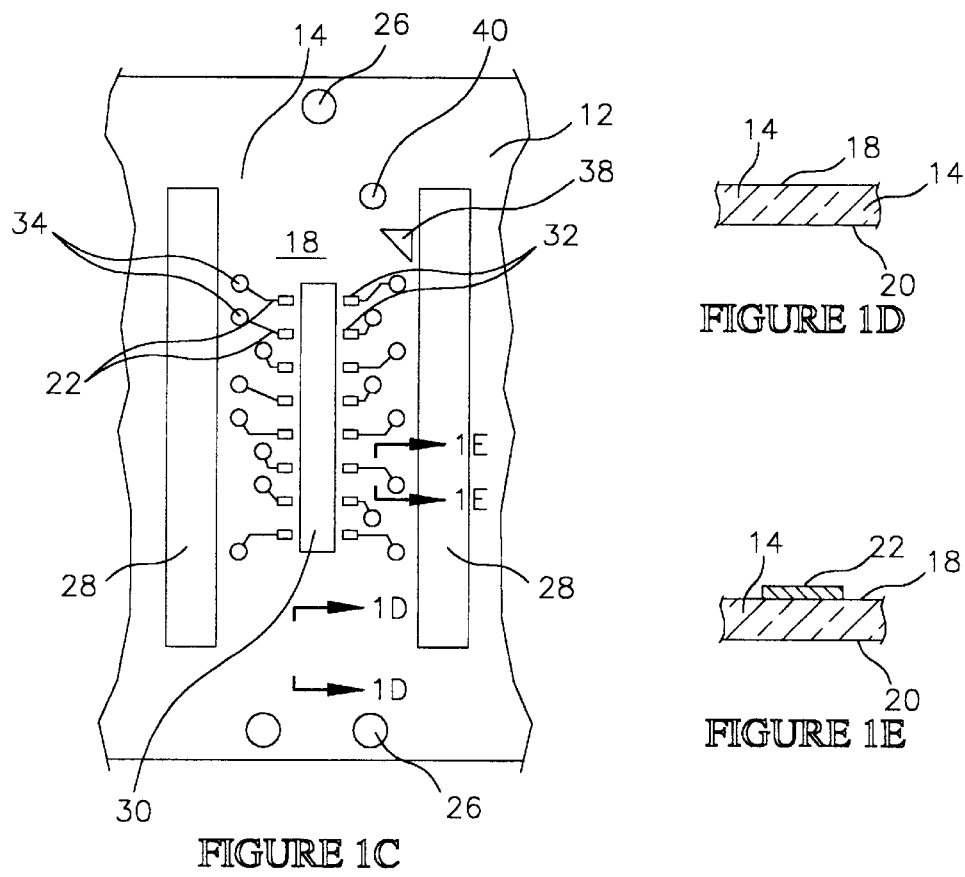
FIGURE 1C
FIGURE 1D
FIGURE 1E

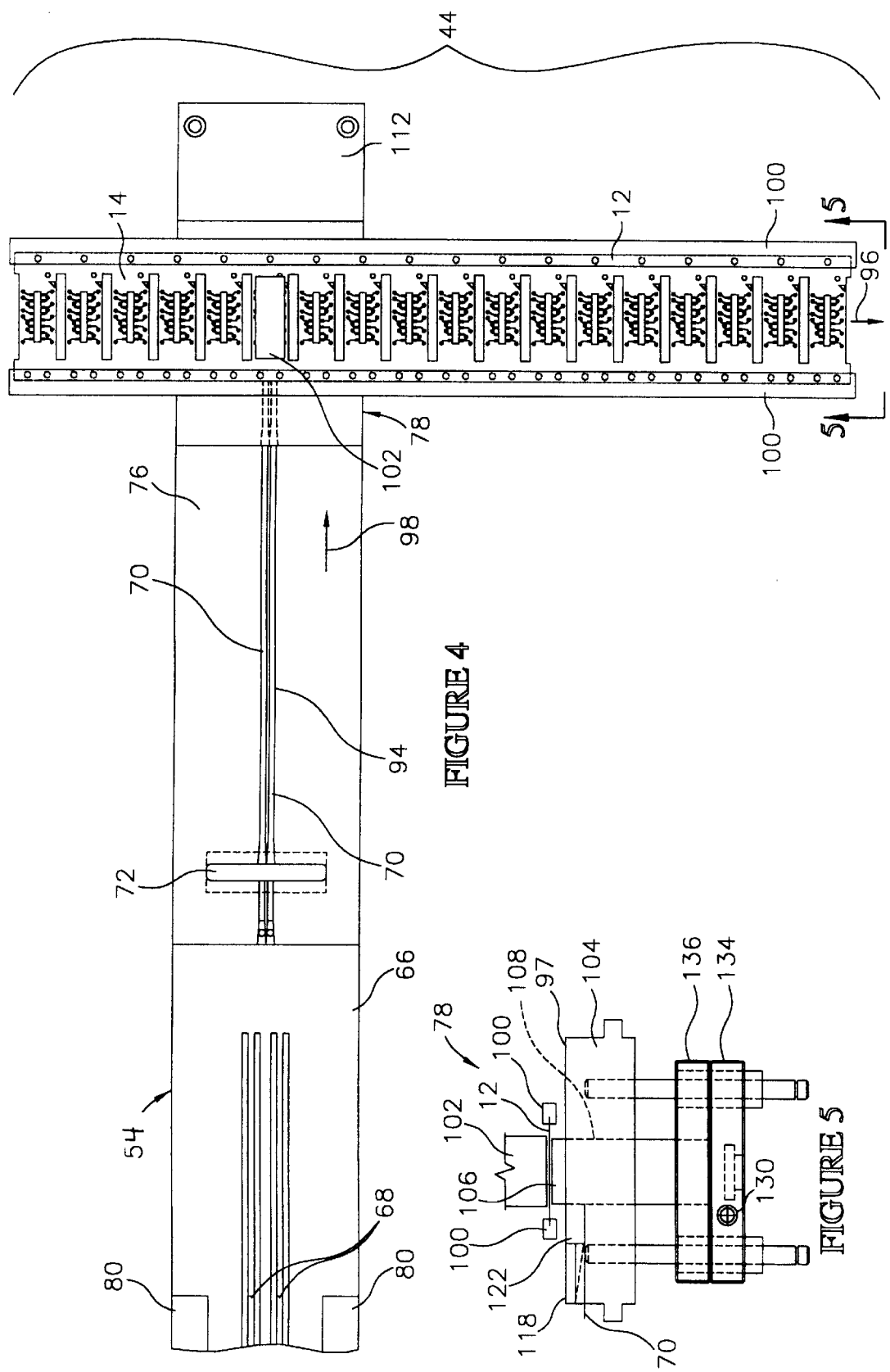

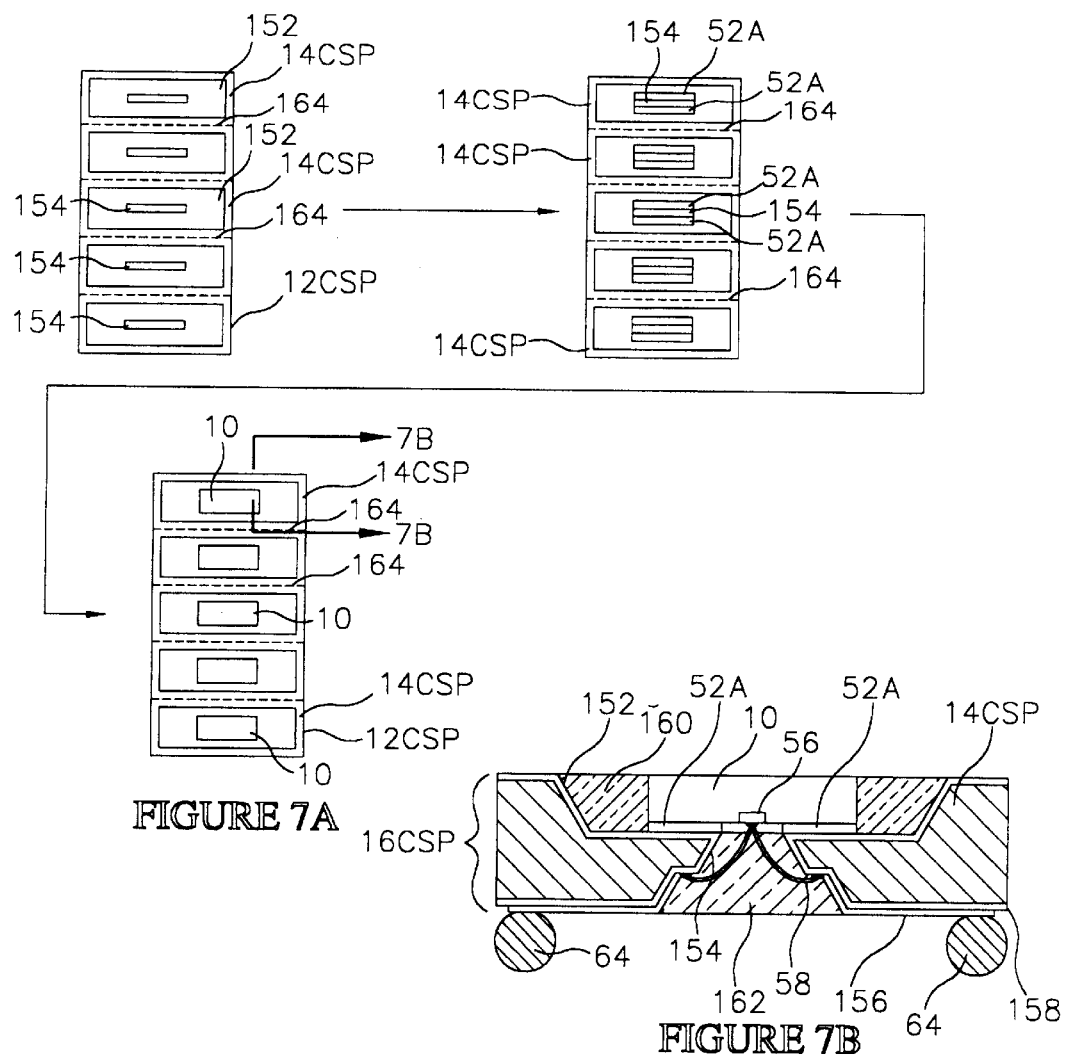
FIGURE 7A
FIGURE 7B
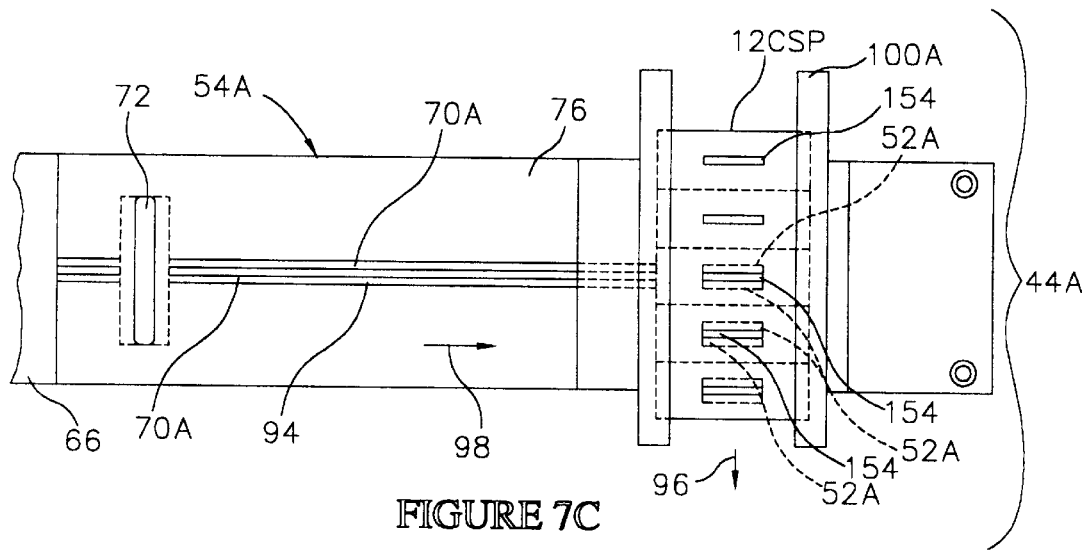
FIGURE 7C

METHOD AND SYSTEM FOR FABRICATING SEMICONDUCTOR COMPONENTS

CROSS REFERENCE TO RELATED APPLICATIONS

This application is a continuation-in-part of application Ser. No. 09/033,497, U.S. Pat. No. 6,025,212 filed Mar. 2, 1998, which is a continuation of application Ser. No. 08/509, 048, filed Jul. 31, 1995, abandoned.

Field of the Invention

This invention relates generally to semiconductor manufacture, and specifically to an improved method and system for fabricating semiconductor components.

BACKGROUND OF THE INVENTION

Semiconductor dice are used to construct various semiconductor components, such as semiconductor packages and multi chip modules. These semiconductor components typically include a substrate on which bare semiconductor dice are mounted. For example, conventional plastic semiconductor packages can include substrates in the form of metal leadframes. During a packaging process the bare dice are attached and electrically connected to the leadframes, and then encapsulated in a plastic resin.

Besides leadframes, other types of substrates are used to construct semiconductor components. For example, other types of semiconductor packages, such as "BGA packages" and "chip scale packages", include substrates which can comprise a glass filled plastic, such as FR-4, or FR-5, or in some cases silicon, or ceramic. Multi chip modules and circuit boards, can also include plastic, silicon, or ceramic substrates, on which semiconductor dice, as well as other electronic components, are mounted.

During fabrication of a semiconductor component the dice are attached to the substrate. One method for attaching the dice to the substrate is by forming an adhesive layer between the dice and the substrate. For example, die attach adhesives, such as epoxy and silicone, can be used to back bond dice to substrates. Typically, the adhesive is dispensed in viscous form from a pressurized nozzle, and then cured to harden. However, for some applications it is not practical to use an adhesive because the viscous material may undesirably adhere to the surfaces of bond pads, and other electrical elements on the die or substrate, and adversely affect the electrical characteristics of the component. Also for some applications, it may not be possible to uniformly form the adhesive layer with a required planarity and geometrical configuration.

Another technique for attaching dice to lead frame substrates employs adhesive tape. For example, during fabrication of a lead-on-chip semiconductor package, semiconductor dice are attached to a metal leadframe using double sided adhesive decals. With a typical lead-on-chip fabrication process the decals are punched with a required peripheral configuration from a length of tape. Portions of the tape that do not become part of the decal are then discarded.

While adhesive tape has been used successfully in the manufacture of plastic semiconductor packages constructed with metal lead frames, it has typically not been used in the volume manufacture of other types of semiconductor components. The present invention is directed to a method and system for fabricating various types of semiconductor components using adhesive tape to attach one or more semiconductor dice to a substrate. In addition, the present invention makes decals without wasted tape, and with accurate alignment of the decal, the substrate, and the die to one another.

SUMMARY OF THE INVENTION

In accordance with the present invention, an improved method and system for fabricating semiconductor components, such as packages, multi chip modules, and printed circuit boards, are provided.

In a first embodiment the method is used to fabricate a BGA package. The BGA package includes a substrate, a semiconductor die attached to the substrate, and one or more adhesive decals attaching the die to the substrate. In this embodiment the substrate comprises an organic polymer such as bismaleimide-triazine, epoxy or polyimide, reinforced with glass fibers. The substrate is provided as a strip of material, on which multiple BGA packages are formed, and then singulated by cutting or shearing.

The method uses one or more continuous ribbons of tape which are cut into decals, and then applied to required areas of the substrate. The tape can comprise a double-sided, multi-layered adhesive tape, such as polyimide film coated on both sides with an adhesive, or alternately a single layer of adhesive material configured as tape. The decals are cut and applied to the substrate by indexing lengths of the tape into guide openings, aligning the substrate to the openings, and then moving cutters through the guide openings to cut and place the decals on the substrate. A finished dimension (e.g., width) of each decal is the same as a width of the tape. Another finished dimension (e.g., length) of each decal is controlled by cutting an indexed length of the tape. Using this method there is no wasted tape. In addition, there are only two cut edges per decal, and only one cut is required for each index of the tape and substrate.

A system for performing the method of the invention includes the substrate, the die, and a tape cutting apparatus configured to cut, and apply, the decals to the substrate. The system also includes a substrate handling apparatus configured to align the substrate during cutting and applying of the decals.

The tape cutting apparatus includes: a support frame for rotatably mounting one or more reels of adhesive tape of a desired width; a tape guide for guiding continuous ribbons of tape from the reels into guide openings for cutting; a pair of feed rollers for continuously feeding and indexing the ribbons of tape into the guide openings; and a cutter assembly adapted to move through the guide openings to cut the decals from the ribbons of tape held in the guide openings, and to apply the decals in a desired pattern to a die mounting area of the substrate.

The substrate is positioned proximate to the guide openings of the cutter assembly by the substrate handling apparatus. The substrate handling apparatus also indexes the substrate to align selected die mounting areas on the substrate to the cutter assembly for application of the cut decals.

In a second embodiment the method is used to fabricate a chip scale package comprising a substrate, a semiconductor die attached to the substrate, and one or more cut decals attaching the die to the substrate. In this embodiment the substrate is provided as a silicon, ceramic or plastic panel on which multiple chip scale packages are formed, and then singulated. In a third embodiment the method is used to fabricate a multi chip module, or a printed circuit board, comprising a substrate on which multiple semiconductor dice are attached using cut decals.

BRIEF DESCRIPTION OF THE DRAWINGS

FIG. 1A is a plan view of a strip containing multiple substrates suitable for fabricating BGA packages in accordance with a first embodiment of the invention;

FIG. 1B is a bottom view of the strip;

FIG. 1C is an enlarged portion of a substrate on the strip taken along section line 1C—1C of FIG. 1A;

FIG. 1D is a cross sectional view of the substrate taken along section line 1D—1D of FIG. 1C;

FIG. 1E is a cross sectional view of the substrate taken along section line 1E—1E of FIG. 1C;

FIG. 4 is a plan view of a system for fabricating semiconductor components in accordance with the invention;

FIG. 5 is an end view taken along section line 5—5 of FIG. 4;

FIG. 7A is a schematic plan view illustrating steps in a second embodiment of the method of the invention during fabrication of chip scale packages;

FIG. 7B is an enlarged cross sectional view taken along section line 7B—7B of FIG. 7A illustrating a completed chip scale package;

FIG. 7C is a plan view of an alternate embodiment system constructed in accordance with the invention for fabricating the chip scale package of FIG. 7B;

DETAILED DESCRIPTION OF THE PREFERRED EMBODIMENT

Referring to FIGS. 1A–1E, a polymer strip 12 comprising a plurality of substrates 14 is illustrated. As will be further explained, the polymer strip 12 can be used to fabricate a plurality of BGA packages 16 (FIG. 2C) in accordance with the invention. In FIGS. 1A–1E, the polymer strip 12 is illustrated prior to attachment of a plurality of semiconductor dice 10 (FIG. 2B) to the substrates 14.

The polymer strip 12 comprises an electrically insulating polymer material, such as an organic polymer resin reinforced with glass fibers. Suitable materials include bismaleimide-triazine (BT), epoxy resins (e.g., "FR-4" and "FR-5"), and polyimide resins. These materials can be formed with a desired thickness, and then punched, machined, or otherwise formed with a required peripheral configuration, and with required features. A representative thickness of the polymer strip 12 can be from about 0.2 mm to 1.6 mm.

Figure 2A:
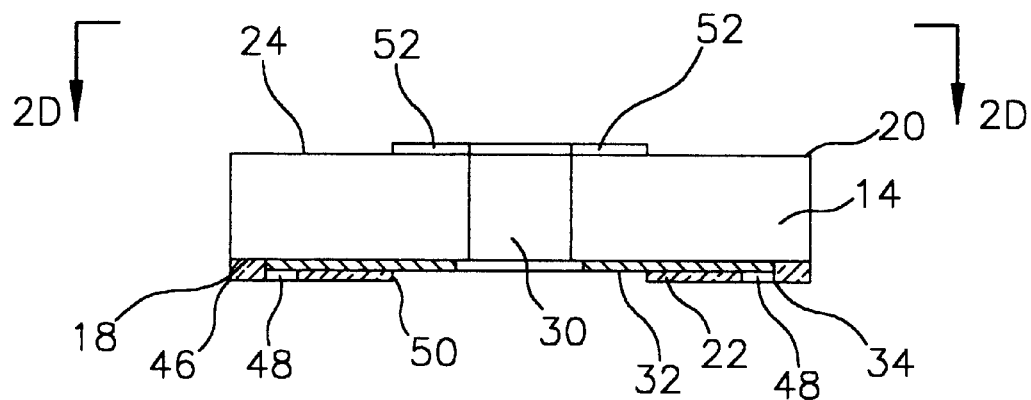
FIGS. 2A–2C are schematic cross sectional views illustrating steps in the first embodiment of the method of the invention during fabrication of a BGA package.
Figure 2B:
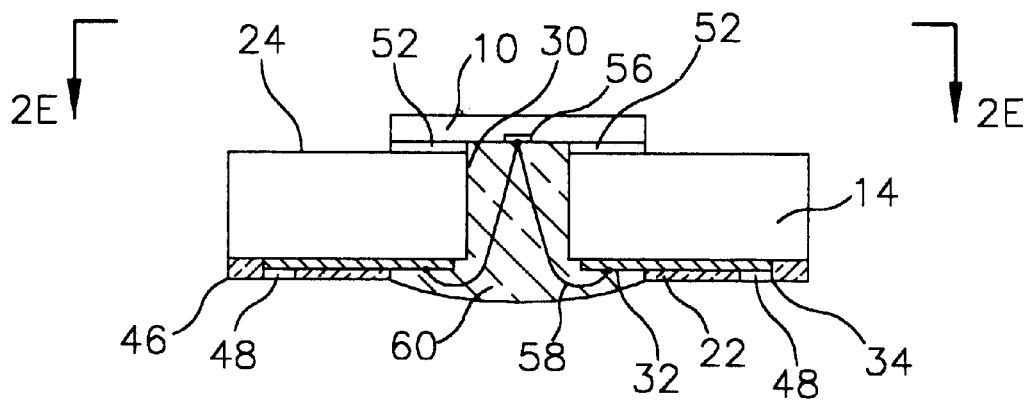
Figure 2C:
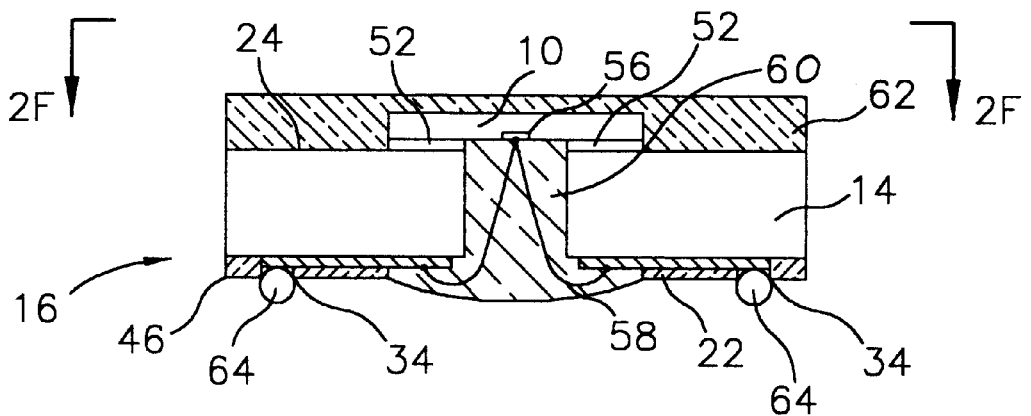

Each substrate 14 is a segment of the polymer strip 12, and will subsequently be separated from the adjacent substrates 14 to form a BGA package 16BGA (FIG. 2C). In the illustrative embodiment there are eighteen substrates 14 on the polymer strip 12. However, this number is merely exemplary and the polymer strip 12 can include a fewer, or greater, number of substrates 14. The polymer strip 12 facilitates the fabrication process in that different operations, such as die attach, and wire bonding, can be performed at the same time on each of the substrates 14.

Each substrate 14 includes a first surface 18 (FIG. 1A), and an opposing second surface 20 (FIG. 1B). The first surface 18, and the second surface 20, are the major planar surfaces of the substrates 14. Each substrate 14 also includes a pattern of conductors 22 (FIG. 1C) formed on the first surface 18 thereof, and a corresponding die attach area 24 (FIG. 1B) formed on the second surface 20 thereof.

As shown in FIG. 1A, the polymer strip 12 includes circular indexing openings 26 formed along the longitudinal edges thereof. The indexing openings 26 permit the polymer strip 12 to be handled by various apparatuses such as lead frame handlers, wire bonders, molds, and trim machinery used during fabrication of semiconductor components in accordance with the invention. The polymer strip 12 also includes elongated separation openings 28 which facilitate singulation of the substrates 14 on the polymer strip 12 into separate BGA packages 16 (FIG. 2C). The substrates 14 also include wire bonding openings 30 which provide access for wire bonding semiconductor dice 10 (FIG. 2B) to the patterns of conductors 22 on the substrates 14.

Referring to FIG. 1C, a single substrate 14 and the conductors 22 on the substrate 14 are shown in greater detail. The conductors 22 can comprise a conductive metal layer, which is blanket deposited onto the substrate 14 (e.g., electroless or electrolytic plating), and then etched in required patterns. Alternately, an additive process, such as electroless deposition through a mask, can be used to form the conductors 22 in required patterns. A preferred metal for the conductors 22 is copper. Other suitable metals for the conductors 22 include aluminum, titanium, tungsten, tantalum, platinum, molybdenum, cobalt, nickel, gold, and iridium. If desired, the substrate 14 and conductors 22 can be constructed from a commercially produced bi-material core, such as a copper clad bismaleimide-triazine (BT) core, available from Mitsubishi Gas Chemical Corp., Japan. A representative weight of the copper can be from 0.5 oz to 2 oz. per square foot.

As shown in FIG. 1C, each conductor 22 includes a wire bonding pad 32 and a ball bonding pad 34. The wire bonding pads 32 can subsequently be plated with metals such as nickel and gold to facilitate the wire bonding process. The ball bonding pad 34 can also subsequently be plated with a solder flux to facilitate attachment of solder balls 36 (FIG. 2C) thereto.

As shown in FIG. 1C, the polymer strip 12 also includes a plurality of triangular metal segments 38, and a plurality of circular metal segments 40 formed on the first surface 18. The metal segments 38, 40 can comprise a same metal as the conductors 22. The triangular shaped metal segments 38 function as a pin #1 indicators. The circular metal segment 40 functions as alignment fiducials. As shown in FIG. 1B, the polymer strip 12 also includes a plurality of square metal segments 42 and a plurality of triangular metal segments 38 formed on the second surface 20. The square metal segments 42 function as gate breaks for a mold compound. The triangular metal segments 38 functions as pin #1 indicators.

Referring to FIGS. 2A–2C, steps in the method for fabricating the BGA package 16BGA (FIG. 2C) using the polymer strip 12 and the method of the invention are illustrated. For simplicity, only one substrate 14 on the polymer strip 12 is illustrated in FIGS. 2A–2C. However, in actual practice the steps in the fabrication method are performed on all of the substrates 14 on the polymer strip 12 prior to singulation of the polymer strip 12 into individual BGA packages 16.

Initially, as shown in FIG. 2A, a solder mask 46 can be formed on the first surface 18 of the substrate 14. The solder mask 46 includes openings 48 aligned with the ball bonding pads 34 on the first surface 18. In addition, the solder mask 46 includes an opening 50 that exposes the wire bonding pads 32, and portions of the conductors 22 on the first surface 18. The solder mask 46 can be formed by exposing and developing a photoimageable dielectric material, such as a negative or positive tone resist. Suitable resist formulations are manufactured by Ciba-Geigy, Shipley and Taiyo America.

As also shown in FIG. 2A, decals 52 are attached to the die attach area 24 on the second surface 20 of the substrate 14 using a tape cutting apparatus 54 (FIG. 3) constructed in accordance with the invention. The decals 52 are cut by the tape cutting apparatus 54 (FIG. 3) from a length of tape. The tape can comprise a conventional double sided adhesive tape comprising a polymer substrate, such as polyimide, coated on both sides with an adhesive. Alternately, the tape can comprise a single layer of adhesive material, configured as tape.

Figure 2D:
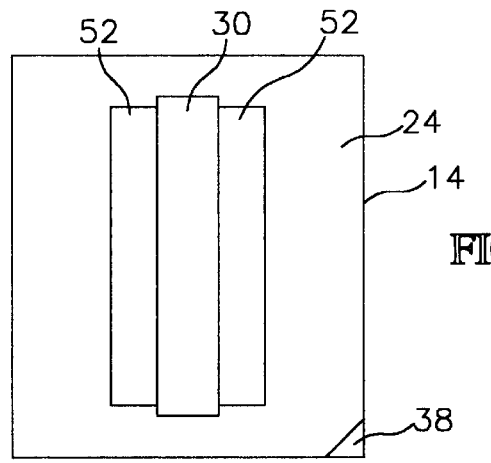
FIG. 2D is a plan view taken along section line 2D—2D of FIG. 2A.
Figure 2E:
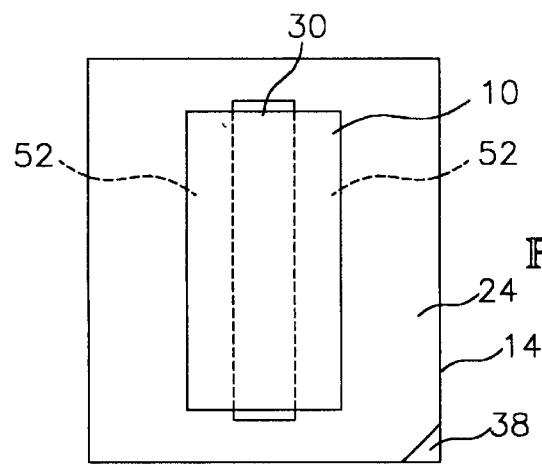
FIG. 2E is a plan view taken along section line 2E—2E of FIG. 2B.

As will be further explained, a width of the tape is the same as the width of the decals 52. This width, and the length of the decals 52, are selected such that the decals 52 cover selected portions of the die attach area 24 and the die 10 (FIG. 2E). In the embodiment illustrated in FIG. 2D, the decals 52 have a generally rectangular peripheral configuration, and are located along opposing longitudinal edges of the wire bonding opening 30 in the substrate 14. In addition, the width of the decals 52 is selected such that die bond pads 56 (FIG. 2B), which are located along a center line of the die 10, are not covered by the decals 52.

Referring to FIG. 2B, following attachment of the decals 52 to the substrate 14, the die 10 can be attached to the decals 52, and thus to the substrate 14. A conventional die attach apparatus can be used to attach the die 10 to the decals 52. In addition, the die 10 can be attached to the decals 52 circuit side down, with the die bond pads 56 aligned with the wire bonding opening 30 in the substrate 14. As shown in FIG. 2E, a peripheral outline of the die 10 substantially matches that of the spaced decals 52.

As also shown in FIG. 2B, wires 58 can be wire bonded to the die bond pads 56 on the die 10, and to the wire bonding pads 32 on the substrate 14. A conventional wire bonding apparatus can be used to perform the wire bonding step. In addition, a glob top encapsulant 60 can be formed in the wire bonding opening 30 and on the wires 58. The glob top encapsulant 60 can comprise a curable polymer applied using a nozzle, or a tool, as is conventional in the art.

Figure 2F:
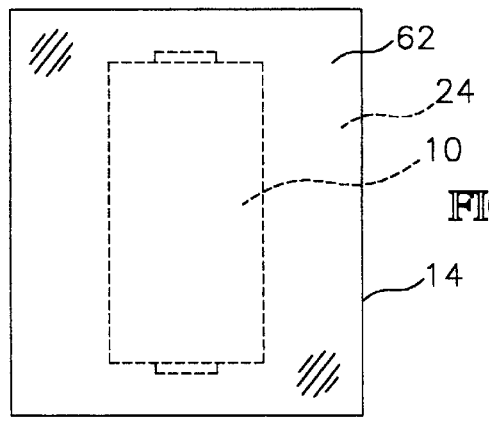
FIG. 2F is a plan view taken along section line 2F—2F of FIG. 2C.

Referring to FIG. 2C, following wire bonding, a molded encapsulant 62 can be formed on the die 10, and on the die attach area 24 of the substrate 14. The molded encapsulant 62 can comprise a Novolac based epoxy formed in a desired shape using a transfer molding process, and then cured using an oven. As shown in FIG. 2F, the molded encapsulant 62 substantially covers the die attach area 24 on the substrate 14.

As also shown in FIG. 2C, following formation of the molded encapsulant 62, solder balls 64 can be bonded to the ball bonding pads 34 on the substrate 14. A solder reflow process can be used to bond the solder balls 64 to the ball bonding pads 34. Prior to the solder reflow process, solder flux can be deposited on the ball bonding pads 34 and on the solder balls 64. The solder balls 64 can then be placed on the ball bonding pads 34, and a furnace used to form metallurgical solder joints between the solder balls 64 and the ball bonding pads 34. During bonding of the solder balls 64, the openings 48 in the solder mask 46 facilitate alignment of the solder balls 64 to the ball bonding pads 34. In addition, in the completed BGA package 16BGA, the solder mask 46 insulates adjacent solder balls 64 and insulates the conductors 22 from the solder balls.

Figure 3:
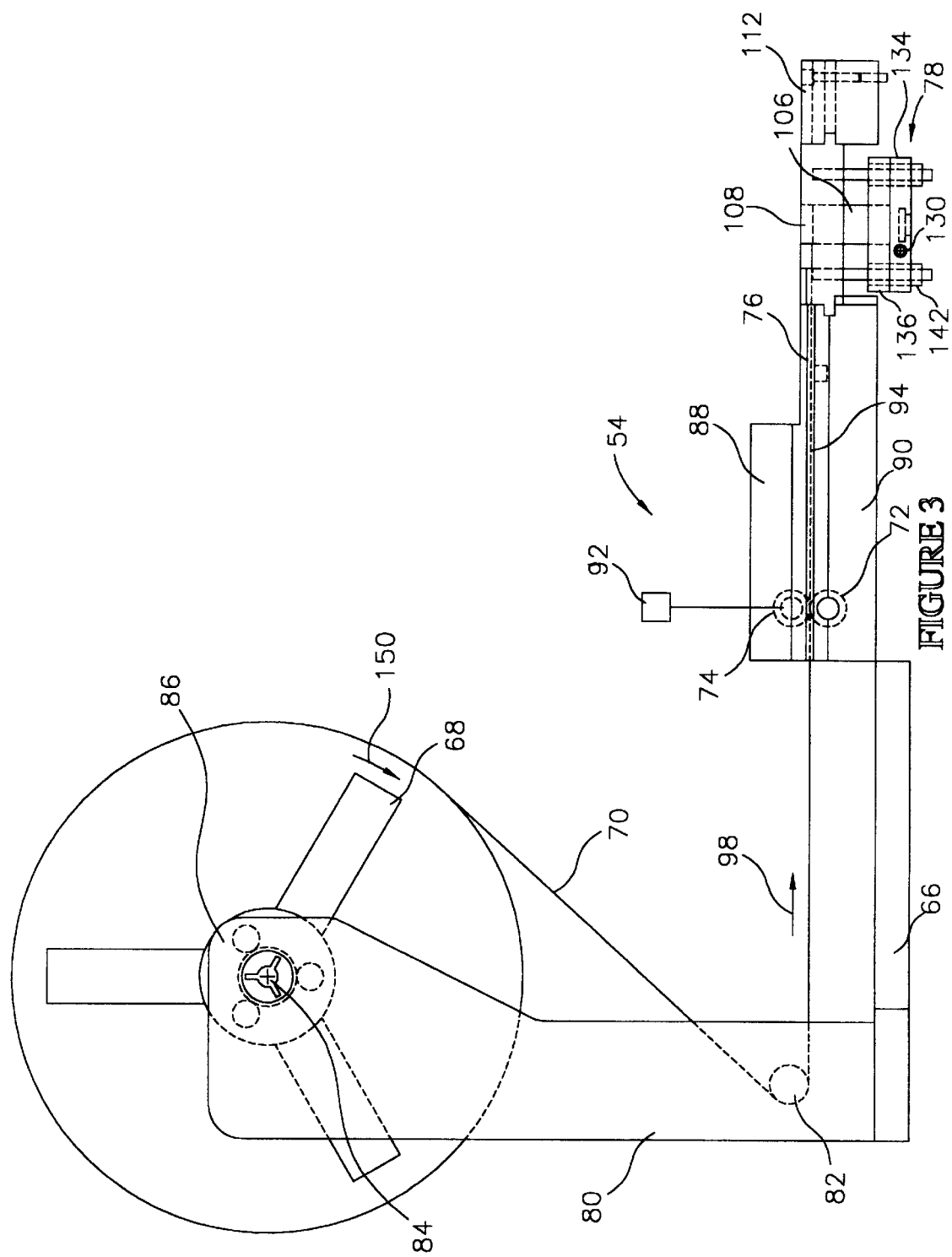
FIG. 3 is a side elevation view of a tape cutting apparatus constructed in accordance with the invention for cutting and applying decals to the substrate.

Referring to FIG. 3, the tape cutting apparatus 54 which is configured for fabricating the BGA package 16BGA (FIG. 2C) in accordance with the invention is shown. The tape cutting apparatus 54 includes: a support frame 66; a plurality of tape reels 68 freely rotatably mounted to the support frame 66 and adapted to supply continuous lengths of adhesive tape 70 for cutting; a pair of tape feed rollers 72, 74 for feeding and indexing the tape 70 for cutting; a tape guide 76 for guiding the tape 70 for cutting; and a tape cutter assembly 78 for cutting the tape 70 into decals 52 (FIG. 2A).

In the illustrative embodiment, there are two tape reels 68 for supplying two continuous lengths of tape 70 and two cut decals 52 per die 10. However, depending on the application, and the number of decals required for each die 10, the method of the invention can be practiced using a greater or lesser number of tape reels 68.

The support frame 66 includes vertical supports 80 adapted to support the tape reels 68 for rotation. The vertical supports 80 include idler rollers 82 for supporting the tape 70. Each tape reel 68 includes a mounting shaft 84 and the vertical supports 80 include bearings 86 for supporting the mounting shafts 84 for rotation. The mounting shafts 84 are removably journaled to the bearings 86 to permit removal and replacement of the tape reels 68 as the tape 70 on the reels 68 is used.

The tape 70 comprises a flexible polymer material, such as polyimide, coated on both sides with an adhesive. By way of example, one suitable tape 70 is "Hitachi HM 122U" tape manufactured by Hitachi Chemical Co. LTD. This tape has an overall thickness of about 0.0035" and is coated with about a 0.0008" thick layer of adhesive on both sides. A width of the tape 70 is the same as the finished width of the cut decals 52. Accordingly, the width of the tape 70 is selected to form the decals 52 with a finished width to cover selected portions of the substrate 14 (FIG. 2D). By way of example, a representative width of the tape can be from 0.047 inches to 0.120 inches. Alternately, the tape can comprise a single layer of adhesive an adhesive material configured as tape.

As shown in FIG. 3, the tape feed rollers 72, 74 are rotatably mounted on an upper roller mount 88 and a lower roller mount 90 respectively. The tape feed rollers 72, 74 are driveably connected to stepper motors 92 adapted to drive the tape feed rollers 72, 74 through predetermined complete or partial revolutions. Each revolution, or partial revolution, of the tape feed rollers 72, 74 moves the tape 70 a corresponding linear amount. The upper tape feed roller 74 is spring loaded in the vertical direction to permit tensioning of the tape 70 as required. In this manner the tape feed rollers 72, 74 can feed, or index, a predetermined length of tape 70 through the tape guide 76 and into the tape cutter assembly 78 for cutting.

The tape guide 76 is formed with a guide channel 94 for receiving the tape 70 from each tape reel 68. In addition, the guide channel 94 is adapted to maintain a precise spacing and parallel orientation of the ribbons of tape 70 as they are fed and indexed by the tape feed rollers 72, 74 into the tape cutter assembly 78. In FIG. 4, the upper roller mount 88 and tape feed roller 74 are cut away to show the confinement of the tape 70 within the guide channel 94. The tape 70 is fully enclosed by the guide channel 94 from a point just upstream of the tape feed rollers 72, 74 to the tape cutter assembly 78. As will be further explained, the tape cutter assembly 78 is also configured to enclose and guide the tape 70 for cutting.

Referring to FIGS. 4 and 5, a system 44 for fabricating the BGA package 16BGA is illustrated. The system 44 includes the tape cutting apparatus 54 and a substrate handling apparatus 100. The tape cutter assembly 78 of the tape cutting apparatus 54 is configured to cut the decals 52 (FIG. 2D) from the ribbon of tape 70, and to press the cut decals 52 against the substrate 14. In a subsequent step, the die 10 will be pressed against the decals 52 for securing the die 10 to the substrate 14. FIG. 2D shows the relative locations of the decals 52 after being cut and pressed by the tape cutter assembly 78 to the substrate 14. In the illustrative embodiment a pair of decals 52 are applied to the substrate 14. Alternately a greater or lesser number of decals 52 can be applied to the substrate 14. Furthermore, the decals 52 can be applied to other portions of the substrate 14, and can have other peripheral configurations than shown.

The substrate handling apparatus 100 is configured to index and align the polymer strip 12 and the substrate 14 for application of the decals 52. Specifically, at the same time that the ribbons of tape 70 are fed into the tape cutter assembly 78, the polymer strip 12 containing the substrate 14 is also fed and indexed into the tape cutter assembly 78 by the substrate handling apparatus 100. The relative position of the polymer strip 12 with respect to the ribbons of tape 70 is clearly shown in FIG. 4. In general, the orientation and direction of movement 96 of the polymer strip 12 is generally perpendicular to the orientation and direction of movement 98 of the ribbons of tape 70. The polymer strip 12 is indexed into the tape cutter assembly 78 such that one die attach area 24 (FIG. 1B) at a time is positioned for the simultaneous application of the cut decals 52 (FIG. 2D).

The substrate handling apparatus 100 can comprise a conventional leadframe handling apparatus. A suitable leadframe handling apparatus is manufactured by ESC Manufacturing, Inc., Ivyland, Pa., and is designated a Model 2000 CA. As shown in FIG. 5, the substrate handling apparatus 100 guides and indexes the polymer strip 12 to a location proximate to the tape cutters 106 suitable for applying the cut decals 52 to the substrate 14. As also shown in FIG. 5, the substrate handling apparatus 100 can include a heat block 102 to provide the heat necessary to activate the adhesive on the tape 70, and to hold the polymer strip 12 down as the decals 52 are applied by the tape cutter assembly 78 to the substrate 14.

Figure 6:
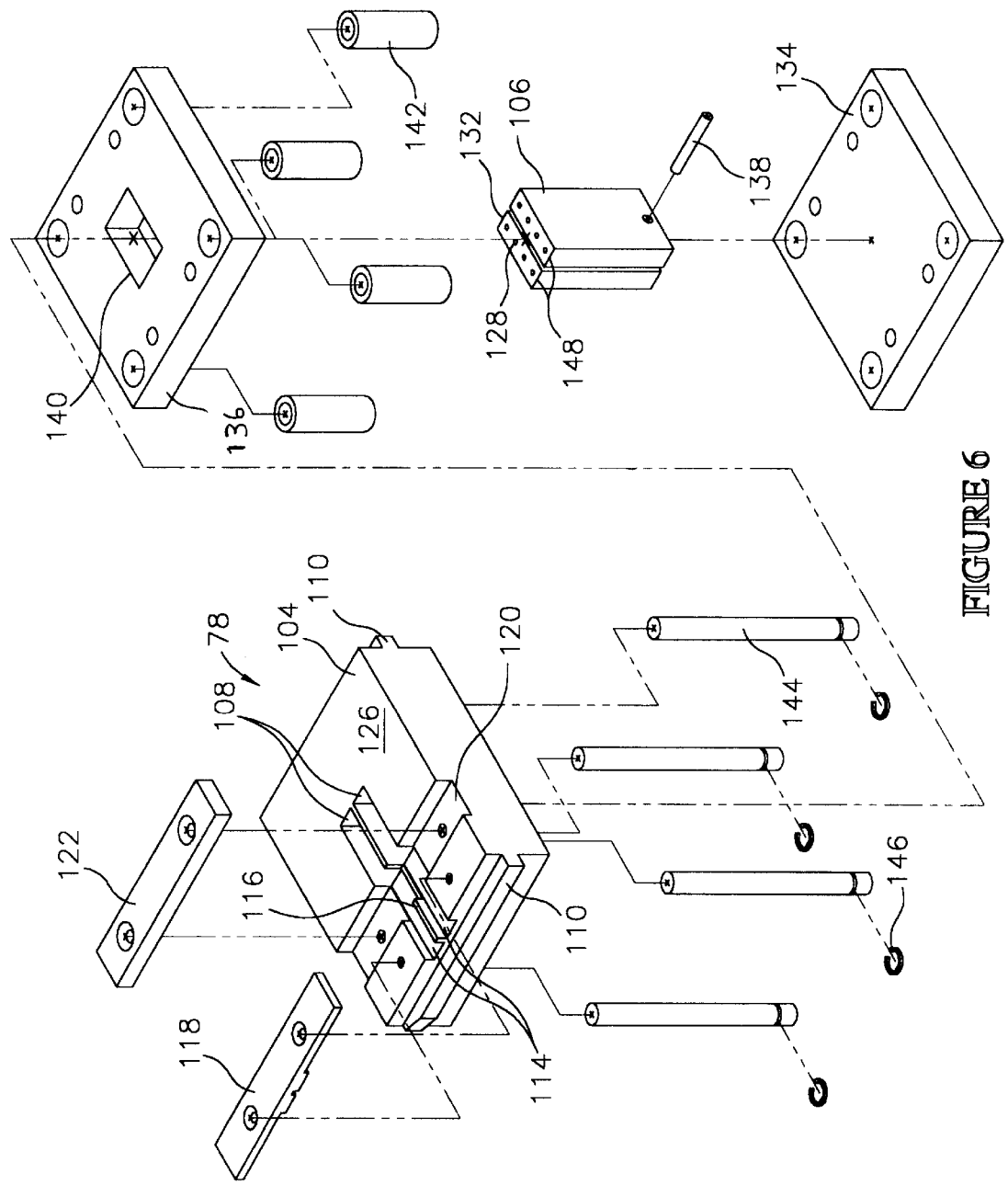
FIG. 6 is an exploded view of a portion of the tape cutting apparatus of FIG. 3 illustrating a tape cutter assembly of the apparatus.

Referring to FIG. 6, components of the tape cutter assembly 78 are shown in an exploded view. The tape cutter assembly 78 includes a cutter base 104; a pair of tape cutters 106 mounted for reciprocal movement with respect to the cutter base 104; and a pair of guide openings 108 for aligning the tape 70 with the tape cutters 106 for cutting.

The cutter base 104 is formed as a solid metal block and includes dovetails 110 on either side configured for attachment to the tape guide 76 (FIG. 3), and to a mounting block 112 (FIG. 3) of the support frame 66. The cutter base 104 also includes separate entrance channels 114 separated by a partition 116. The entrance channels 114 are sized for receiving and maintaining separation of the ribbons of tape 70. The partition 116 is sized to maintain a desired separation between the ribbons of tape 70, which in the illustrative embodiment is approximately equal to the width of the wire bonding opening 30 (FIG. 2D). A tape lead-in member 118 attaches to the cutter base 104 to cover the entrance channels 114 and form spaced rectangular passages separated by the partition 116.

As also shown in FIG. 6, a rectangular groove 120 is formed in the cutter base 104 wherein a cutter block 122 is mounted. The ribbons of tape 70 are guided by the entrance channels 114 under the lead-in member 118 and under the cutter block 122. As clearly shown in FIG. 5, the lead-in member 118 is tapered to guide the tape 70 under the cutter block 122. The cutter block 122 is adapted to hold the uncut ribbons of tape 70 down as the decals 52 (FIG. 2D) are simultaneously cut and pressed against the substrate 14.

The guide openings 108 for the cut decals 52 extend through the full thickness of the cutter base 104. The guide openings 108 are adapted to align the ribbons of tape 70 with the tape cutters 106 and to align the cut decals 52 with the substrate 14. As clearly shown in FIG. 5, the tape cutters 106 are adapted to move through the guide openings 108 to cut the ribbons of tape 70. Furthermore, the tape cutters 106 are adapted for movement past an upper surface 126 of the cutter base 104 to press the cut decals 52 against the substrate 14, which is held against the heat block 102. The tape cutters 106 include vacuum passages 128 in flow communication with a vacuum conduit 130 (FIG. 5). The vacuum passages 128 apply a vacuum force to the decals 52 for securing the cut decals 52 to the tape cutters 106 as the cutters 106 are extended to press the decals 52 against the substrate 14. The vacuum conduit 130 (FIG. 5) is in flow communication with a vacuum source (not shown) and suitable control valves (not shown) for effecting cycling of the vacuum to the vacuum passages 128 as required.

A peripheral outline of the decals 52 matches the peripheral outline of the end surfaces 132 of the tape cutters 106, and also the peripheral outline of the guide openings 108. In the illustrative embodiment the decals 52 have a generally rectangular peripheral shape. However, other peripheral shapes such as a polygonal, square, circular, or oval are also possible. Depending on the dimensions of the die 10, the tape cutters 106 and guide openings 108 can be dimensioned as required.

As also shown in FIG. 6, the tape cutters 106 are attached to a mounting plate 134 and to a mounting shoe 136. A dowel pin 138 secures the tape cutters 106 to one another and to the mounting plate 134. The mounting shoe 136 includes a rectangular opening 140 for the tape cutters 106. Sleeve bearings 142 are attached to the mounting shoe 136 and mounting plate 134 and slide over guide posts 144 attached to the cutter base 104. Retaining rings 146 are attached to the guide posts 144 to prevent the sleeve bearings 142 from sliding off the guide posts 144. The assembled tape cutter assembly 78 is clearly shown in FIGS. 3 and 5.

The tape cutters 106 are formed with sharp, burr-free cutting edges 148 for cutting the ribbons of tape 70. In addition, the tape cutters 106 include a finished surface (e.g., 8 micro inches). The guide openings 108 in the cutter base 104 are also formed with finished surfaces. The location of the tape cutters 106 with respect to the cutter block 122 is controlled by the guide openings 108 in the cutter base 104. Therefore the clearance between the tape cutters 106 and the guide openings 108 must be as small as possible but still maintain free sliding movement of the tape cutters 106 through the guide openings 108.

The mounting plate 134, mounting shoe 136 and tape cutters 106 are adapted to be driven up and down on the guide posts 144 by a hydraulic cylinder or other actuator (not shown). By way of example, a reciprocating speed for the tape cutters 106 can be on the order of 40 strokes per minute.

Referring to FIG. 3, during the operation of the tape cutting apparatus 54, the tape feed rollers 72, 74 unwind the tape reels 68 in the directions indicated by rotational arrow 150. The ribbons of tape 70 move in a linear direction 98. The ribbons of tape 70 are driven by the tape feed rollers 72, 74 through the tape guide 76 and into the entrance channels 114 (FIG. 6) in the tape cutter assembly 78.

Indexing of the ribbons of tape 70 by the tape feed rollers 72, 74 is such that the tape 70 substantially fills the guide openings 108 (FIG. 6) in the cutter base 104. The amount the tape 70 is indexed and the size of the guide openings 108 are selected to provide a desired finished length for the cut decals 52. With a die attach area 24 of the substrate 14 positioned over the guide openings 108, the tape cutters 106 are actuated to cut the tape 70 to form the decals 52. At the same time that the edge 148 (FIG. 6) of the tape cutters 106 cuts the decals 52, the end surfaces 132 (FIG. 6) of the tape cutters 106 press the decals 52 against the heated substrate 14. The vacuum passages 128 function to attach the decals 52 to the surface 132 of the cutters 106 as the decals 52 are pressed against the substrate 14.

Once the decals 52 are cut and pressed against the die attach area 24 of the substrate 14, the tape cutters 106 are retracted. The polymer strip 12 is then indexed to position another substrate 14 and die attach area 24 over the guide openings 108 in the cutter base 104. The above sequence is then repeated for forming and pressing decals 52 against the adjacent die attach area 24.

Using the tape cutting apparatus 54 the decals 52 are cut and applied without wasted tape. In addition, the alignment openings 108 of the tape cutter assembly 78 align the tape 70 to the cutters 106, and also align the cut decals 52 to the substrate 14. The size of the decals 52 can be determined by selection of the width and index of the tape, and by the length of the guide openings 108. In addition, the spacing between the guide openings 108 determines the spacing between the cut decals 52, and the location of the decals 52 on the substrate 14.

Referring to FIGS. 7A–7C, steps in a method for fabricating a chip scale package 16CSP (FIG. 7B) in accordance with a second embodiment of the invention are illustrated. As shown in FIG. 7B, the chip scale package 16CSP comprises a substrate 14CSP, and a semiconductor die 10 attached to the substrate 14CSP using decals 52A formed using a tape cutting apparatus 54A (FIG. 7C) constructed substantially as previously described for tape cutting apparatus 54 (FIG. 3).

In the illustrative embodiment, the substrate 14CSP comprises silicon, but alternately can comprise ceramic, plastic or a glass filled resin such as FR-4. The substrate 14CSP can be initially provided on a silicon panel 12CSP with a plurality of other substrates 14CSP. The silicon panel 12CSP will subsequently be singulated by cutting or shearing along separation lines 164 into multiple chip scale packages 16CSP. The silicon panel 12CSP can have a size and peripheral configuration substantially similar to the polymer strip 12 (FIG. 1A) previously described. Alternately, the silicon panel 12CSP can have other peripheral configurations such as square, circular, or the shape of semiconductor wafer blank.

As shown in FIG. 7B, the substrate 14CSP includes a die mounting recess 152, and a wire bonding recess 154. The substrate 14CSP also includes a pattern of conductors 156 in electrical communication with solder balls 64 formed in a dense array (e.g., ball grid array) on a surface of the substrate 14CSP. Electrically insulating layers 158 comprising $SiO_2$, or other insulating material, insulate the bulk of the substrate 14CSP from the conductors 156. Also, wires 58 are bonded to the conductors 156 on the substrate 14CSP, and to the die bond pads 56 on the die 10. In addition, a polymer die encapsulant 160 in the die mounting recess 152 substantially encapsulates the die 10, and a polymer wire bonding encapsulant 162 in the wire bonding recess 154 substantially encapsulates the wires 58 and associated wire bonds.

Further details of the chip scale package 16CSP are disclosed in commonly assigned U.S. Pat. Nos. 5,674,785 and 5,739,585 to Akram et al., which are incorporated herein by reference.

For fabricating the chip scale package 16CSP, the silicon panel 12CSP can be provided as shown on the left segment of FIG. 7A, with multiple substrates 14CSP having the die mounting recesses 152 and the wire bonding recesses 154 formed therein. The die mounting recesses 152 and the wire bonding recesses 154 can be formed using an anisotropic etch process as described in the above cited '785 and '585 patents. In addition, the silicon panel 12CSP can be provided with the conductors 156, which can be formed using a metallization process, such as CVD and etching, or electrodeposition, as described in the above cited '785 and '585 patents.

Next, as shown in the center segment of FIG. 7A, the decals 52A can be attached to the substrates 14CSP. The decals 52A can be formed and attached substantially as previously described.

As shown in FIG. 7C, a system 44A for fabricating the chip scale package 16CSP includes a tape cutting apparatus 54A formed substantially as previously described for apparatus 54 and configured to cut the decals 52A from ribbons of tape 70A, and to apply the decals 52A to the substrates 14CSP. The system also includes a substrate handling apparatus 100B configured to handle and index the silicon panel 12CSP during application of the decals 52A. The substrate handling apparatus 100B can comprise a conventional leadframe handling apparatus. A suitable leadframe handling apparatus is the previously identified model 2000 CA manufactured by ESC Manufacturing, Inc., Ivyland, Pa.

Following attachment of the decals 52A to the substrates 14CSP, and as shown in the right segment of FIG. 7A, the dice 10 can be attached to the decals 52A, and thus to the substrates 14CSP. Attachment of the dice 10 can be performed with a die attacher as previously described. Following attaching of the dice 10, the wires 58 (FIG. 7B) can be wire bonded to the die bond pads 56 and to the conductors 156, and the encapsulants 160, 162 (FIG. 7B) can be formed in the die mounting recesses 152 and the wire bonding recesses 154. These steps can be performed as disclosed in the above cited '785 and '585 patents. The panel 12CSP can then be separated by cutting or shearing along separation lines 164 into individual chip scale packages 16CSP.

Figure 8A:
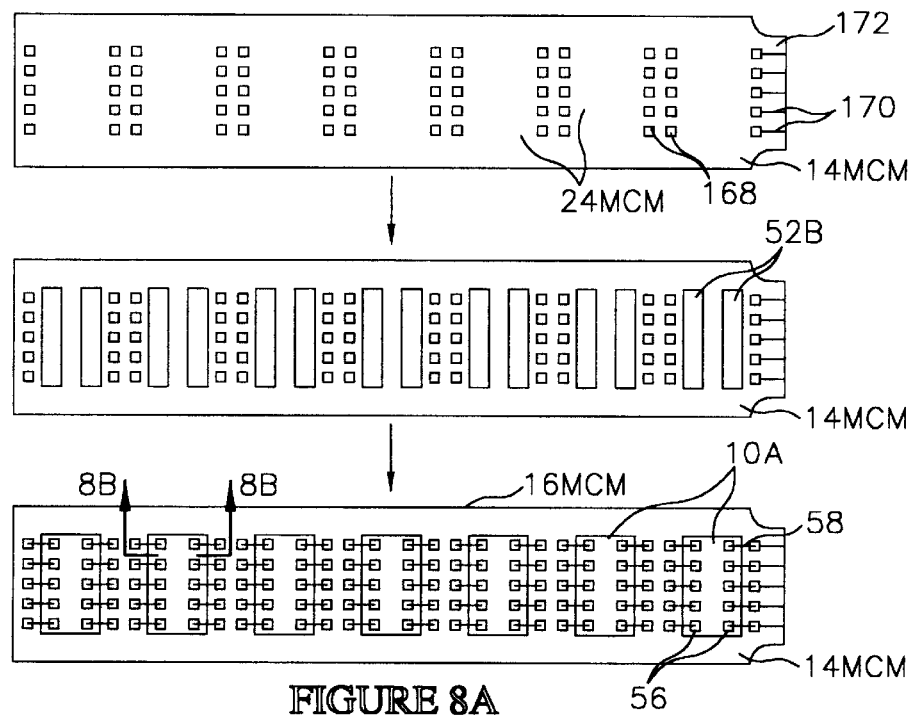
FIG. 8A is a schematic plan view illustrating steps in a third embodiment of the method of the invention during fabrication of a multi chip module.
Figure 8B:
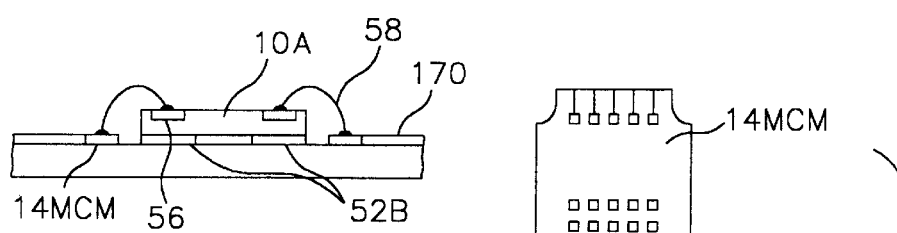
FIG. 8B is an enlarged cross sectional view taken along section line 8B—8B of FIG. 8A illustrating a die on the multi chip module.
Figure 8C:
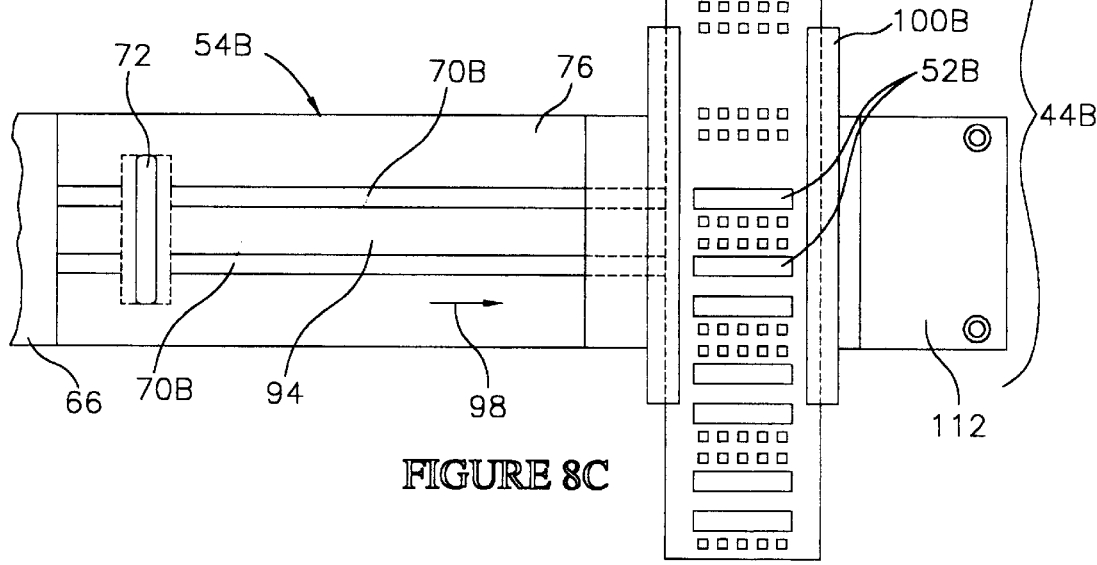
FIG. 8C is a plan view of an alternate embodiment system constructed in accordance with the invention for fabricating the multi chip module of FIG. 8A.

Referring to FIGS. 8A–8C, steps in a method for fabricating a multi chip module 16MCM (FIG. 8A) in accordance with a third embodiment of the invention are illustrated. The multi chip module 16MCM comprises a substrate 14MCM and a plurality of semiconductor dice 10A attached to the substrate 14MCM using decals 52B formed using a tape cutting apparatus 54B (FIG. 8C) constructed substantially as previously described for tape cutting apparatus 54 (FIG. 3).

In the illustrative embodiment, the substrate 14MCM comprises silicon, ceramic, or a glass filled resin such as FR-4. The substrate 14MCM can have a size and peripheral configuration substantially similar to the polymer strip 12 (FIG. 1A) previously described. Alternately, the substrate 14MCM can have other peripheral configurations. In addition, the substrate 14MCM can be similar in construction to a printed circuit board, and can include other required electrical components such as resistors, diodes and capacitors.

Initially, as shown in the top segment of FIG. 8A, the substrate 14MCM can be provided with die attach areas 24MCM. In addition, the substrate 14MCM includes bond pads 168 and conductors 170 in electrical communication with an edge connector 172. For simplicity only a few conductors 170 are illustrated. However, each bond pad 168 will be in electrical communication with an associated conductor 170.

Next, as shown in the center segment of FIG. 8A, the decals 52B can be attached to the substrate 14MCM. The decals 52B can be formed and attached substantially as previously described using a system 44B. As shown in FIG. 8C, the system 44B includes a tape cutting apparatus 54B formed substantially as previously described for apparatus 54. The tape cutting apparatus 54 is configured to cut the decals 52B from ribbons of tape 70B, and to apply the decals 52B to the substrate 14MCM. The system 44B also includes a substrate handling apparatus 100B configured to handle and index the substrate 14MCM during application of the decals 52B. The substrate handling apparatus 100B can comprise a conventional substrate handling apparatus. A suitable substrate handling apparatus is the previously identified model 2000CA manufactured by ESC Manufacturing, Inc., Ivyland, Pa.

Following attachment of the decals 52B to the substrate 14MCM, and as shown in the right segment of FIG. 8A, the dice 10A can be attached to the decals 52B, and thus to the substrate 14MCM. Attachment of the dice 10A can be performed with a die attacher as previously described. Following attaching of the dice 10A, the wires 58 (FIG. 8B) can be wire bonded to the die bond pads 56, and to the conductors 170 on the substrate 14MCM.

Thus the invention provides an improved method and system for fabricating semiconductor components. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
    providing a semiconductor die;
    providing a substrate comprising a polymer material;
    providing an adhesive tape with a width;
    providing a tape cutter apparatus configured to cut the tape to form a decal with a first finished dimension equal to the width of the tape and a second finished dimension equal to an indexed length of the tape;
    forming the decal using the tape cutter apparatus;
    attaching the decal to the substrate; and
    attaching the die to the decal to attach the die to the substrate.

2. The method of claim 1 wherein the substrate comprises a material selected from the group consisting of bismaleimide-triazine, epoxy or polyimide.

3. The method of claim 1 wherein the semiconductor component comprises a ball grid array package.

4. A method for fabricating a semiconductor component comprising:
    providing a semiconductor die;
    providing a substrate comprising silicon or ceramic;
    providing an adhesive tape with a width;
    providing a tape cutter apparatus configured to cut the tape to form a decal with a first finished dimension equal to the width of the tape and a second finished dimension equal to an indexed length of the tape;
    forming the decal using the tape cutter apparatus;
    attaching the decal to the substrate; and
    attaching the die to the decal to attach the die to the substrate.

5. The method of claim 4 wherein the semiconductor component comprises a ball grid array package.

6. The method of claim 4 further comprising forming a plurality of decals using the tape cutter apparatus, attaching the decals to the substrate and attaching the die the decals.

7. The method of claim 4 further comprising forming a Pair of decals using the tape cutter apparatus, attaching the pair of decals to the substrate, and attaching the die to the pair of decals.

8. A method for fabricating a semiconductor component comprising:
    providing a semiconductor die;
    providing a substrate comprising an insulating material;
    providing an adhesive tape with a width;
    providing a tape cutter apparatus comprising an opening configured to receive the tape and a cutter configured to move through the opening to cut the tape;
    indexing a length of the tape into the opening;
    cutting the length of the tape with the cutter to form a decal with a first finished dimension equal to the width of the tape and a second finished dimension equal to the length of the tape;
    applying the decal to the substrate; and
    attaching the die to the decal to attach the die to the substrate.

9. The method of claim 8 further comprising aligning and locating the decal on the substrate using the opening in the tape cutter apparatus.

10. The method of claim 8 wherein the substrate comprises a material selected from the group consisting of plastic or ceramic.

11. A method for fabricating a semiconductor component comprising:
    providing a semiconductor die;
    providing a substrate comprising an insulating material;
    providing an adhesive tape with a width;
    providing a tape cutter apparatus comprising a base, an opening in the base configured to receive the tape, and a cutter configured to move through the opening to cut the tape;
    indexing a length of the tape into the opening;
    following the indexing step, cutting the length of the tape using the cutter to form a decal with a first finished dimension equal to the width of the tape and a second finished dimension equal to the length of the tape;
    aligning and locating the decal with respect to the substrate using an alignment and location of the opening with respect to the substrate;

attaching the decal to the substrate; and attaching the die to the decal to attach the die to the substrate.

12. The method of claim 11 wherein the tape cutter apparatus comprises a channel in the base configured to guide the tape into the opening, and a block configured to hold the tape in the channel as the tape is cut.

13. The method of claim 11 wherein the semiconductor component comprises a ball grid array package and the substrate comprises bismaleimide-triazine.

14. The method of claim 11 wherein the semiconductor component comprises a ball grid array package and the substrate comprises a polymer resin reinforced with glass fibers.

15. The method of claim 11 wherein the semiconductor component comprises a ball grid array package and the substrate comprises a material selected from the group consisting of ceramic and plastic.

16. The method of claim 11 wherein the semiconductor component comprises a multi chip module and the substrate comprises a material selected from the group consisting of silicon, ceramic or plastic.

17. A method for fabricating a semiconductor component comprising:

providing a semiconductor die;

providing a substrate comprising a polymer material;

providing an adhesive tape having a width;

providing a tape cutter apparatus comprising a base, an opening in the base configured to receive the tape, and a cutter configured to move through the opening to cut the tape;

indexing a length of the tape into the opening;

positioning a die attach area of the substrate proximate to the opening;

cutting the tape by extending the cutter through the opening to form a decal having a first finished dimension equal to the width of the tape and a second finished dimension controlled by the indexing step;

applying the decal to the die attach area using an alignment and location of the opening relative to the die attach area to align and locate the decal; and attaching the die to the decal to attach the die to the substrate.

18. The method of claim 17 wherein the substrate comprises a polymer strip comprising a plurality of substrates.

19. The method of claim 17 wherein the substrate comprises a polymer strip comprising a plurality of substrates, and positioning the die attach area is performed using a lead frame handler.

20. The method of claim 17 wherein the substrate comprises a material selected from the group consisting of bismaleimide-triazine, epoxy, polyimide.

* * * * *